United States Patent
Ryu et al.

(10) Patent No.: US 7,414,268 B2
(45) Date of Patent: Aug. 19, 2008

(54) HIGH VOLTAGE SILICON CARBIDE MOS-BIPOLAR DEVICES HAVING BI-DIRECTIONAL BLOCKING CAPABILITIES

(75) Inventors: Sei-Hyung Ryu, Cary, NC (US); Jason R. Jenny, Wake Forest, NC (US); Mrinal K. Das, Durham, NC (US); Hudson McDonald Hobgood, Pittsboro, NC (US); Anant K. Agarwal, Chapel Hill, NC (US); John W. Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 91 days.

(21) Appl. No.: 11/132,355

(22) Filed: May 18, 2005

(65) Prior Publication Data

US 2006/0261347 A1    Nov. 23, 2006

(51) Int. Cl.
*H01L 31/0312* (2006.01)
*H01L 29/76* (2006.01)
*H01L 29/94* (2006.01)
*H01L 31/062* (2006.01)
*H01L 31/113* (2006.01)

(52) U.S. Cl. .................. 257/77; 257/329; 257/339

(58) Field of Classification Search ............. 257/77, 257/329, 339
See application file for complete search history.

(56) References Cited

U.S. PATENT DOCUMENTS

| | | | |
|---|---|---|---|
| 3,629,011 A | 12/1971 | Tohi et al. | |
| 4,466,172 A | 8/1984 | Batra | |
| 4,779,126 A | 10/1988 | Herman | |
| 4,811,065 A | 3/1989 | Cogan | |
| 5,021,854 A | 6/1991 | Huth | |
| 5,111,253 A | 5/1992 | Korman et al. | |
| 5,170,231 A | 12/1992 | Fujii et al. | |
| 5,184,199 A | 2/1993 | Fujii et al. | |
| 5,264,713 A | 11/1993 | Palmour | |
| 5,270,554 A | 12/1993 | Palmour | |
| 5,313,092 A | 5/1994 | Tsuruta et al. | |
| 5,348,895 A | 9/1994 | Smayling et al. | |
| 5,384,270 A | 1/1995 | Ueno | |
| 5,385,855 A | 1/1995 | Brown et al. | |
| 5,393,999 A | 2/1995 | Malhi | |
| 5,396,085 A | 3/1995 | Baliga | |

(Continued)

FOREIGN PATENT DOCUMENTS

DE    19809554    9/1998

(Continued)

OTHER PUBLICATIONS

A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.

(Continued)

*Primary Examiner*—Shouxiang Hu
(74) *Attorney, Agent, or Firm*—Myers Bigel Sibley & Sajovec (57) ABSTRACT

Silicon carbide high voltage semiconductor devices and methods of fabricating such devices are provided. The devices include a voltage blocking substrate. Insulated gate bipolar transistors are provided that have a voltage blocking substrate. Planar and beveled edge termination may be provided.

21 Claims, 5 Drawing Sheets

U.S. PATENT DOCUMENTS

| | | | |
|---|---|---|---|
| 5,506,421 | A | 4/1996 | Palmour |
| 5,510,281 | A | 4/1996 | Ghezzo et al. |
| 5,510,630 | A | 4/1996 | Agarwal |
| 5,539,217 | A | 7/1996 | Edmond et al. |
| 5,629,531 | A | 5/1997 | Palmour |
| 5,663,580 | A | 9/1997 | Harris et al. |
| 5,710,059 | A | 1/1998 | Rottner |
| 5,712,502 | A | 1/1998 | Mitlehner et al. |
| 5,726,463 | A | 3/1998 | Brown et al. |
| 5,734,180 | A | 3/1998 | Malhi |
| 5,763,905 | A | 6/1998 | Harris |
| 5,804,483 | A | 9/1998 | Harris |
| 5,814,859 | A | 9/1998 | Ghezzo et al. |
| 5,831,288 | A | 11/1998 | Singh et al. |
| 5,837,572 | A | 11/1998 | Gardner et al. |
| 5,851,908 | A | 12/1998 | Harris et al. |
| 5,877,041 | A | 3/1999 | Fuller |
| 5,917,203 | A | 6/1999 | Bhatnagar et al. |
| 5,972,801 | A | 10/1999 | Lipkin et al. |
| 5,976,936 | A | 11/1999 | Miyajima et al. |
| 6,020,600 | A | 2/2000 | Miyajima et al. |
| 6,025,233 | A | 2/2000 | Terasawa |
| 6,025,608 | A | 2/2000 | Harris et al. |
| 6,054,352 | A | 4/2000 | Ueno |
| 6,096,607 | A | 8/2000 | Ueno |
| 6,100,169 | A | 8/2000 | Suvorov et al. |
| 6,107,142 | A | 8/2000 | Suvorov et al. |
| 6,117,735 | A | 9/2000 | Ueno |
| 6,121,633 | A | 9/2000 | Singh et al. |
| 6,133,587 | A | 10/2000 | Takeuchi et al. |
| 6,162,665 | A | 12/2000 | Zommer |
| 6,165,822 | A | 12/2000 | Okuno et al. |
| 6,180,958 | B1 | 1/2001 | Cooper, Jr. |
| 6,204,135 | B1 | 3/2001 | Peters et al. |
| 6,221,700 | B1 | 4/2001 | Okuno et al. |
| 6,228,720 | B1 | 5/2001 | Kitabatake et al. |
| 6,238,967 | B1 | 5/2001 | Shiho et al. |
| 6,239,463 | B1 | 5/2001 | Williams et al. |
| 6,246,076 | B1 | 6/2001 | Lipkin et al. |
| 6,297,100 | B1 | 10/2001 | Kumar et al. |
| 6,303,508 | B1 | 10/2001 | Alok |
| 6,316,791 | B1 | 11/2001 | Schorner et al. |
| 6,344,663 | B1 | 2/2002 | Slater, Jr. et al. |
| 6,399,996 | B1 | 6/2002 | Chang et al. |
| 6,420,225 | B1 | 7/2002 | Chang et al. |
| 6,429,041 | B1 | 8/2002 | Ryu et al. |
| 6,448,160 | B1 | 9/2002 | Chang et al. |
| 6,455,892 | B1 | 9/2002 | Okuno |
| 6,551,865 | B2 | 4/2003 | Kumar et al. |
| 6,573,534 | B1 | 6/2003 | Kumar et al. |
| 6,593,620 | B1 | 7/2003 | Hshieh et al. |
| 6,610,366 | B2 | 8/2003 | Lipkin |
| 6,653,659 | B2 | 11/2003 | Ryu et al. |
| 6,759,684 | B2 | 7/2004 | Fukuda et al. |
| 6,767,843 | B2 | 7/2004 | Lipkin et al. |
| 6,974,720 | B2 | 12/2005 | Sumakeris et al. |
| 2001/0017374 | A1* | 8/2001 | Carter et al. ............... 257/78 |
| 2002/0038891 | A1 | 4/2002 | Ryu et al. |
| 2002/0047125 | A1 | 4/2002 | Fukuda et al. |
| 2002/0102358 | A1 | 8/2002 | Das et al. |
| 2003/0079676 | A1 | 5/2003 | Ellison et al. |
| 2004/0101625 | A1 | 5/2004 | Das et al. |
| 2004/0119076 | A1 | 6/2004 | Ryu |
| 2004/0211980 | A1 | 10/2004 | Ryu |
| 2004/0212011 | A1 | 10/2004 | Ryu |
| 2004/0216661 | A1 | 11/2004 | Kordina |
| 2004/0222501 | A1 | 11/2004 | Kordina |
| 2005/0000406 | A1 | 1/2005 | Janzen et al. |
| 2005/0029557 | A1 | 2/2005 | Hatakeyama et al. |
| 2005/0082542 | A1* | 4/2005 | Sumakeris et al. ............ 257/77 |
| 2006/0194400 | A1* | 8/2006 | Cooper et al. ............... 438/309 |

FOREIGN PATENT DOCUMENTS

| | | |
|---|---|---|
| DE | 19832329 A1 | 2/1999 |
| DE | 19900171 | 7/1999 |
| DE | 10036208 | 2/2002 |
| EP | 0 637 069 B1 | 2/1995 |
| EP | 1 204 145 A2 | 5/2002 |
| EP | 1 058 317 A2 | 12/2002 |
| JP | 01117363 | 5/1985 |
| JP | 03034466 | 2/1991 |
| JP | 03157974 | 7/1991 |
| JP | 08264766 | 10/1996 |
| JP | 09205202 | 8/1997 |
| JP | 11191559 | 7/1999 |
| JP | 11238742 | 8/1999 |
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 2000106371 | 4/2000 |
| JP | 2001185727 A * | 7/2001 |
| WO | WO 97/08754 | 3/1997 |
| WO | WO 97/39485 | 10/1997 |
| WO | WO 98/02916 | 1/1998 |
| WO | WO 98/02924 | 1/1998 |
| WO | WO 00/13236 | 3/2000 |
| WO | WO2004/020706 A1 | 3/2004 |

OTHER PUBLICATIONS

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Material Science Forum*, vols. 338-342, pp. 1307-1310, 2000.

A.K. Agarwal, S. Seshadri, and L.B. Rowland, "Temperature Dependence of Fowler-Nordheim Current in 6H-and 4H-Sic Mos Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Material Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Baliga, Power Semiconductor Devices, Chapter 7, PWS Publishing, 1996.

Bharnagar et al. "Comparison of 6H-SiC, 3C-SiC, and Si for Power Devices," *IEEE Transactions on Electron Devices*, vol. 40, No. 3, Mar. 1993, pp. 645-655.

Capano, M.A., et al., Ionization Energies and Electron Mobilities in Phosphorus—and Nitrogen-Implanted 4H-Silicon Carbide, IEEE ICSCRAM Conference 1999, Research Triangle Park, North Carilona (Oct. 10-13, 1999).

D. Alok, E. Arnold, and R. Egloff, "Process Dependence of Inversion Layer Mobility in 4H-SiC Devices," *Materials Science Forum*, vols. 338-342, pp. 1077-1080, 2000.

Das, Mrinal K. Graduate thesis entitled, *Fundamental Studies of the Silicon Carbide MOS Structure*, Purdue University, 1999.

Dastidar, Sujoyita, A Study of P-Type Activation in Silicon Carbide, Thesis (Purdue University, May 1998).

Fukuda et al. "Improvement of $SiO_2$/4H-SiC Interface Using High-Temperature Hydrogen Annealing at Low Pressure and Vacuum Annealing," *Jpn. J. Appl. Phys.* vol. 38, Apr. 1999, pp. 2306-2309.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSFETs Following High Temperature Anneals in Nitric Oxide," *IEEE Electron Device Letters*, vol. 22, No. 4, Apr. 2001.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

K. Ueno and Tadaaki Oikawa, "Counter-Doped MOSFET's of 4H-SiC," *IEEE Electron Device Letters*, vol. 20, No. 12, pp. 624-626, Dec. 1999.

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

L.A. Lipkin and J.W. Palmour, "Low interface state density oxides on p-type SiC," *Materials Science Forum* vols. 264-268, pp. 853-856, 1998.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

M.K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Mondal et al., "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition, Motorola, INc., 1989, pp. 2-5-4-2-5-7.

P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.

Palmour et al. "SiC Device Technology: Remaining Issues," *Diamond and Related Materials*. vol. 6, 1997, pp. 1400-1404.

Patel, R., et al., Phosphorus-Implanted High-Voltage N.sup.+ P 4H-SiC Junction Rectifiers, Proceedings of 1998 International Symposium on Poer Semiconductor Devices & ICs, pp. 387-390 (Kyoto).

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

R. Schorner, P. Friedrichs, D. Peters, and D. Stephani, "Significantly Improved Performance of MOSFETs on Silicon Carbide using the 15R-SiC Polytype," *IEEE Electron Device Letters*, vol. 20, No. 5, pp. 241-244, May 1999.

Ranbir Singh, Sei-Hyung Ryu and John W. Palmour, "High Temperature, High Current, 4H-SiC Accu-DMOSFET," *Materials Science Forum* vols. 338-342, pp. 1271-1274, 2000.

Rao et al. "Al and N Ion Implantations in 6H-SiC," Silicon Carbide and Related Materials. 1995 Conf, Kyoto, Japan. Published 1996.

Rao et al. "P-N Junction formation in 6H-SiC by Acceptor Implantation into N-Type Substrate," Nuclear Instruments and Methods in Physics Research B. vol. 106, 1995, pp. 333-338.

Ryu et al. Article and Presentation: "27 $M\Omega\text{-}cm^2$, 1.6 kV Power DiMOSFETs in 4H-SiC," *Proceedings of the 14 International Symposium on Power Semiconductor Devices & ICs 2002*, Jun. 4-7, 2002, Santa Fe, NM.

S. Sridevan and B. Jayant Baliga, "Lateral N-Channel inversion Mode 4H-SiC MOSFET's," *IEEE Electron Device Letters*, vol. 19, No. 7, pp. 228-230, Jul. 1998.

S.T. Pantelides, "Atomic Scale Engineering of SiC Dielectric Interfaces," DARPA/MTO High Power and ONR Power Switching MURI Reviews, Rosslyn, VA, Aug. 10-12, 1999.

Sze, *Physics of Semiconductor Devices, Second Edition*, John Wiley & Sons, 1981, pp. 196-198 and 229-234.

V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.

V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.

Williams et al. "Passivation of the $4H\text{-}SiC/SiO_2$ Interface with Nitric Oxide," *Materials Science Forum*. vols. 389-393 (2002), pp. 967-972.

Y. Wang, C. Weitzel, and M. Bhatnagar, "Accumulation-Mode SiC Power MOSFET Design Issues," *Materials Science Forum*, vols. 338-342, pp. 1287-1290.

U.S. Appl. No. 60/435,212, "Vertical JFET Limited Silicon Carbide Power Metal-Oxide Semiconductor Field Effect Transistors and Methods of Fabricating Vertical JFET Limited Silicon Carbide Power Metal-Oxide Semiconductor Field Effect Transistors," filed Dec. 20, 2002.

U.S. Appl. No. 60/294,307, "Method of $N_2O$ Growth on an Oxide Layer on a Silicon Carbide Layer," filed May 31, 2001.

U.S. Appl. No. 10/686,795, "Methods of Forming Power Semiconductor Devices Using Boule-Grown Silicon Carbide Drift Layers and Power Semiconductor Devices Formed Thereby," filed Oct. 16, 2003.

U.S. Appl. No. 11/052,679, "Process for Producing Silicon Carbide Crystals Having Increased Minority Carrier lifetimes," filed Feb. 7, 2005.

Konstantinov et al., "Ionization rates and critical fields in 4H silicon carbide," Appl. Phys. Lett. 71 (1), Jul. 7, 1997, pp. 90-92.

International Search Report, PCT/US2006/014376, Feb. 24, 2007.

* cited by examiner

HIGH VOLTAGE SILICON CARBIDE MOS-BIPOLAR DEVICES HAVING BI-DIRECTIONAL BLOCKING CAPABILITIES

FIELD OF THE INVENTION

This invention relates to power semiconductor devices and related methods of fabricating power semiconductor devices and, more particularly, to high voltage silicon carbide devices and related methods of fabricating high voltage silicon carbide devices.

BACKGROUND OF THE INVENTION

Power devices are widely used to carry large currents and support high voltages. Modern power devices are generally fabricated from monocrystalline silicon semiconductor material. One type of power device is the thyristor. A thyristor is a bistable power semiconductor device that can be switched from an off-state to an on-state, or vice versa. Power semiconductor devices, such as thyristors, high-power bipolar junction transistors ("HPBJT"), or power metal oxide semiconductor field effect transistors ("MOSFET"), are semiconductor devices capable of controlling or passing large amounts of current and blocking high voltages.

Silicon bipolar transistors have, conventionally, been used for high power applications in motor drive circuits, appliance controls, robotics and lighting ballasts. This is because bipolar transistors can be designed to handle relatively large current densities, for example, in the range of 200 to 50 A/cm$^2$ and support relatively high blocking voltages in the range of 500-2500V.

Despite the attractive power ratings achieved by bipolar transistors, there exist several fundamental drawbacks to their suitability for all high power applications. Bipolar transistors are current controlled devices that typically require relatively large base control currents, typically one fifth to one tenth of the collector current, to maintain the transistor in an on-state mode. Proportionally larger base currents can be expected for applications that also require high speed turn-off. Because of the large base current demands, the base drive circuitry for controlling turn-on and turn-off is relatively complex and expensive. Bipolar transistors may also be vulnerable to premature breakdown if a high current and high voltage are simultaneously applied to the device, as commonly required in inductive power circuit applications. Furthermore, it may be relatively difficult to operate bipolar transistors in parallel because current diversion to a single transistor typically occurs at high temperatures, making emitter ballasting schemes necessary. This current diversion generally results from the decrease in on-state voltage drop across the bipolar device with further increases in operating temperature.

Silicon power MOSFETs address this base drive problem. In a power MOSFET, the gate electrode provides turn-on and turn-off control upon the application of an appropriate gate bias. For example, turn-on in an n-type enhancement MOSFET occurs when a conductive n-type inversion layer is formed in the p-type channel region in response to the application of a positive gate bias. The inversion layer electrically connects the n-type source and drain regions and allows for majority carrier conduction between source and drain.

The power MOSFET's gate electrode is separated from the conducting channel region by an intervening insulating layer, typically silicon dioxide. Because the gate is insulated from the channel region, little gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is typically required during switching. Because of the high input impedance associated with the insulated-gate electrode, minimal current demands are placed on the gate and the gate drive circuitry can be easily implemented.

Moreover, because current conduction in the MOSFET occurs through majority carrier transport only, the delay associated with the recombination of excess minority carriers is not present. Accordingly, the switching speed of power MOSFETs can be made orders of magnitude faster than that of bipolar transistors. Unlike bipolar transistors, power MOSFETs can be designed to simultaneously withstand high current densities and the application of high voltages for relatively long durations, without encountering the destructive failure mechanism known as "second breakdown." Power MOSFETs can also easily be paralleled, because the forward voltage drop of power MOSFETs increases with increasing temperature, thereby promoting an even current distribution in parallel connected devices.

The above-described beneficial characteristics of power MOSFETs are typically offset, however, by the relatively high on-resistance of the MOSFET's drift region for high voltage devices, which arises from the absence of minority carrier injection. As a result, a MOSFET's operating forward current density is typically limited to relatively low values, for example, in the range of 40-50 A/cm$^2$, for a 600 V device, as compared to 100-120 A/cm$^2$ for the bipolar transistor for a similar on-state voltage drop.

On the basis of these features of power bipolar transistors and MOSFET devices, devices embodying a combination of bipolar current conduction with MOS-controlled current flow were developed and found to provide significant advantages in certain applications over single technologies such as bipolar or MOSFET alone. One example of a device which combines bipolar and MOS characteristics is the Insulated Gate Bipolar Transistor (IGBT).

The IGBT combines the high impedance gate of the power MOSFET with the small on-state conduction losses of the power bipolar transistor. Because of these features, the IGBT has been used extensively in inductive switching circuits, such as those required for motor control applications. These applications require devices having wide forward-biased safe-operating-area (FBSOA) and wide reverse-biased safe-operating-area (RBSOA).

Silicon carbide (SiC) devices have also been proposed and used as power devices. Such devices include power MOSFETs such as are described in U.S. Pat. No. 5,506,421. Similarly, silicon carbide Junction Field Effect Transistors (JFETs) and Metal-Semiconductor Field Effect Transistors (MESFETs) have also been proposed for high power applications. See U.S. Pat. Nos. 5,264,713 and 5,270,554.

Silicon carbide IGBTs have also been described in U.S. Pat. Nos. 5,831,288 and 6,121,633, the disclosures of which are incorporated herein as if set forth in their entirety.

Notwithstanding the potential advantages of silicon carbide, it may be difficult to fabricate power devices, including IGBTs, in silicon carbide. For example, these high voltage devices are typically formed using a lightly doped epitaxial layer (n or p type) on a highly doped n-type conductivity silicon carbide substrate having a thickness of from about 300 to about 400 μm. Low resistivity p-type silicon carbide substrates may not be available as a result of the available acceptor species (Aluminum and Boron) having deep energy levels that may result in carrier freeze out. Thus, the exclusive use of n-type substrates may limit the polarity of available high voltage devices. For example, only p-channel Insulated Gate Bipolar Transistors (IGBTs) may be available. In addition, the available devices may only be capable of blocking voltages in one direction.

In conventional power circuits it is desirable to have a device that may have the control voltage applied to the device to turn the device on and off referenced to ground rather than to a high positive voltage level. However, to provide an IGBT where the gate is referenced to the grounded emitter of the device generally requires a highly doped p-type substrate. As is noted above, highly doped p-type substrates currently are more difficult to fabricate than n-type substrates in silicon carbide. With an n-type substrate a conventional silicon carbide IGBT would have its gate voltage referenced to the collector voltage that, in a typical power circuit, would be to a line voltage. Thus, present silicon carbide IGBTs may require more complex gate drive circuitry with level shifting components and result in more complex power circuits as a result of the structure of IGBTs, the electrical characteristics of silicon carbide and the limitations in fabrication of highly doped p-type silicon carbide substrates.

Furthermore, in order to form a blocking junction at the substrate-epitaxial layer interface, a planar edge termination structure may be formed or an edge beveling process may be used to reduce the likelihood of premature breakdown at the edges of the device. Forming planar edge termination structures on a backside of the device may be difficult and costly to implement as extensive processing may be needed after removal of the 300 to 400 μm thick n-type substrate. Edge beveling may include etching through the substrate or grinding/polishing the sidewalls of the device, which may also be difficult because the voltage blocking epitaxial layers are generally much thinner than the substrate.

SUMMARY OF THE INVENTION

Some embodiments of the present invention provide high voltage silicon carbide (SiC) devices and methods of fabricating high voltage SiC devices that include a SiC insulated gate bipolar transistor (IGBT) comprising a voltage blocking substrate as a drift region of the IGBT, a planar edge termination structure at a first face of the voltage blocking substrate and surrounding an active region of the IGBT and a beveled edge termination structure extending through a second face of the voltage blocking substrate opposite the first face of the voltage blocking substrate.

In particular embodiments of the present invention, the voltage blocking substrate is a boule grown substrate. The voltage blocking substrate may be a 4H—SiC high purity substrate having a carrier concentration no greater than about $1.0 \times 10^{15}$ cm$^{-3}$. The voltage blocking substrate may have a thickness of greater than about 100 μm. The voltage blocking substrate may comprise an n-type or a p-type SiC substrate.

Some embodiments of the present invention provide high voltage silicon carbide (SiC) devices and methods of fabricating high voltage SiC devices that include a first SiC layer having a first conductivity type on a first surface of a voltage blocking SiC substrate having a second conductivity type, a first region of SiC at a second surface of the substrate and having the first conductivity type, a second region of SiC in the first region of SiC, the second region having the first conductivity type and having a carrier concentration higher than a carrier concentration of the first region, a third region of SiC in the first region of SiC, the third region having the second conductivity type, an insulator layer on the substrate, a gate electrode on the insulator layer and adjacent the first and third regions of SiC, a first contact on the second and third regions of SiC and a second contact on the first SiC layer.

In further embodiments of the present invention, the device further includes a planar edge termination structure at a first face of the substrate and a beveled edge termination structure at a second face of the substrate opposite the first face of the substrate.

In additional embodiments of the present invention, the voltage blocking substrate is a boule grown substrate. The voltage blocking substrate may comprise a 4H—SiC high purity substrate having a carrier concentration no greater than about $1.0 \times 10^{15}$ cm$^{-3}$. The voltage blocking substrate may have a thickness of greater than about 100 μm. The first conductivity type may comprise p-type SiC and the second conductivity type may comprise n-type SiC. Alternatively, the first conductivity type may comprise n-type SiC and the second conductivity type may comprise p-type SiC.

In further embodiments of the present invention, the first SiC layer has a thickness of from about 0.1 to about 20 μm. The first SiC layer may have a carrier concentration of from about $1 \times 10^{16}$ to about $1 \times 10^{21}$ cm$^{-3}$. The first SiC region may have a carrier concentration of from about $1 \times 10^{15}$ to about $5 \times 10^{19}$ cm$^{-3}$ and/or a depth of from about 0.3 to about 2.0 μm. The second SiC region may have a carrier concentration of from about $5 \times 10^{17}$ to about $1 \times 10^{21}$ cm$^{-3}$ and/or a depth of from about 0.1 to about 2.0 μm. The third SiC region may have a carrier concentration of from about $5 \times 10^{17}$ to about $1 \times 10^{21}$ cm$^{-3}$ and/or a depth of from about 0.1 to about 1.5 μm.

In additional embodiments of the present invention, the device further includes fourth regions of SiC at the second surface of the substrate and having the second conductivity type. The fourth regions of SiC provide a planar edge termination structure at a first face of the substrate. The fourth SiC regions may have a carrier concentration of from about $5 \times 10^{17}$ to about $1 \times 10^{21}$ cm$^{-3}$ and/or a depth of from about 0.1 to about 2.0 μm.

While the present invention is described above primarily with reference to high voltage devices and IGBTs, methods of fabricating high voltage devices and IGBTs are also provided herein.

DETAILED DESCRIPTION OF EMBODIMENTS OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the Figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Embodiments of the present invention are described with reference to a particular polarity and/or conductivity type for various layers/regions. However, as will be appreciated by those of skill in the art, the polarity of the regions/layers may be inverted to provide an opposite polarity device. For example, the terms "first conductivity type" and "second conductivity type" refer to opposite conductivity types such as n or p-type, however, each embodiment described and illustrated herein includes its complementary embodiment as well.

Some embodiments of the present invention prevention provide insulated gate bipolar transistors (IGBTs) and/or other power devices that may include silicon carbide voltage blocking substrates as discussed herein. Thus, while embodiments of the present invention are described with reference to IGBTs, embodiments of the present invention may be used in other devices, such as metal oxide semiconductor field effect transistors (MOSFETs), thyristors or other such high voltage power devices.

According to some embodiments of the present invention, high voltage power devices are provided on voltage blocking substrates. Voltage blocking and/or carrier injecting pn junctions may be formed by growth of epilayers and/or ion implantation. Because the removal of the n$^+$ substrate may no longer be required, a planar termination structure may be readily implemented. Furthermore, an edge beveling process may also be simplified according to some embodiments of the present invention as the location of the pn blocking junctions (i.e., between the voltage blocking substrate and the layer formed thereon) may be well defined and the voltage blocking layer (substrate) accounts for most of the thickness of the device. Thus, according to some embodiments of the present invention, high voltage devices may be provided on n-type and/or p-type silicon carbide substrates, which may increase the polarities available in high voltage devices as discussed further herein.

As used herein, a "voltage blocking substrate" refers to an n-type or a p-type high purity silicon carbide substrate capable of providing a bi-directional voltage blocking layer for a high voltage device. In some embodiments of the present invention, the voltage blocking substrate may be a 4H—SiC substrate having a carrier concentration of no greater than about $1.0 \times 10^{15}$ cm$^{-3}$ and a thickness of greater than about 100 µm. The details with respect to the voltage blocking substrate and methods of fabricating the voltage blocking substrate are discussed in commonly assigned U.S. patent application Ser. No. 11/052,679 entitled *Process for Producing Silicon Carbide Crystals Having Increased Minority Carrier Lifetimes,* filed Feb. 7, 2005, the disclosure of which is incorporated herein by reference as if set forth herein in its entirety.

Figure 1:
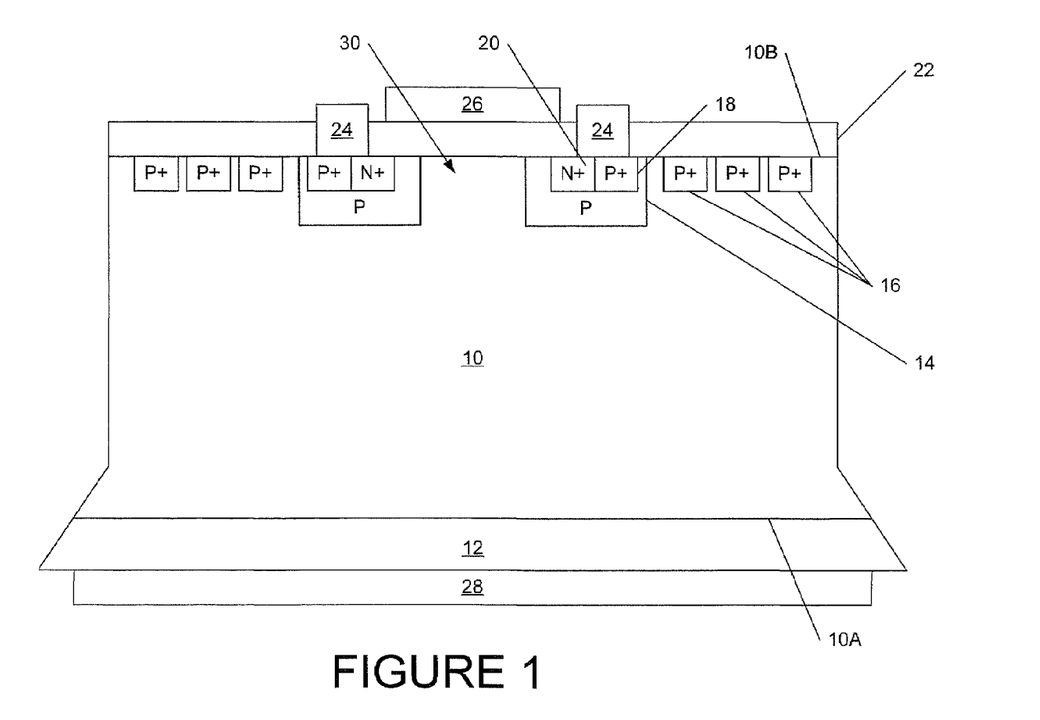
FIG. 1 is a cross section illustrating high voltage silicon carbide devices, for example, IGBTs, according to some embodiments of the present invention.

Embodiments of the present invention are described herein with reference to FIG. 1, which is a cross-section of an insulated gate bipolar transistor (IGBT) structure having implanted regions in a voltage blocking substrate. However, in some embodiments of the present invention, implanted regions may be provided as epitaxial regions on the substrate. Accordingly, embodiments of the present invention are not limited to implantation in a substrate but may also include regions on a substrate or combinations thereof. As is known to those of skill in the art, doped regions of silicon carbide may be formed through epitaxial growth and/or through implantation. For example, a p-type region of silicon carbide may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial region or layer" and "implanted region or layer" structurally distinguish differing regions of silicon carbide.

Referring now to FIG. 1, high voltage silicon carbide devices according to some embodiments of the present invention will be discussed. As illustrated in FIG. 1, a silicon carbide (SiC) voltage blocking substrate 10 may be provided. As discussed above, the polarity of the substrate 10 may be n-type or p-type SiC having a polytype of, for example, 3C, 2H, 4H, 6H or 15R. For exemplary purposes only, devices discussed according to embodiments of the present invention illustrated in FIG. 1 include n-type SiC substrates 10. In some embodiments of the present invention, the substrate 10 may be a high purity 4H SiC substrate having a carrier concentration of no greater than about $1.0 \times 10^{15}$ cm$^{-3}$ and a thickness of greater than about 150 µm. The substrate 10 has a first face 10B and a second face 10A, opposite the first face 10B.

In some embodiments of the present invention, the substrate 10 may be a boule grown substrate. Boule grown substrates are discussed in commonly assigned U.S. patent application Ser. No. 10/686,795, filed Oct. 16, 2003, entitled *Methods of Forming Power Semiconductor Devices using Boule-Grown Silicon Carbide Drift Layers and Power Semiconductor Devices Formed Thereby*, the disclosure of which is hereby incorporated herein by reference as if set forth in its entirety.

As further illustrated in FIG. 1, a first layer of SiC 12 may be provided at a second surface 10A of the substrate 10. The first layer of SiC 12 may be a p-type or an n-type SiC epitaxial layer or implanted layer. As is known to those of skill in the art, doped regions of silicon carbide may be formed through epitaxial growth and/or through implantation. For example, a p-type region of silicon carbide may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial region or layer" and "implanted region or layer" structurally distinguish differing regions of silicon carbide.

According to embodiments of the present invention illustrated in FIG. 1, the first layer of SiC 12 may be an p-type epitaxial layer provided on a n-type substrate 10. The p-type SiC epitaxial layer 12 may have a carrier concentration of from about $1.0 \times 10^{16}$ to about $1.0 \times 10^{21}$ cm$^{-3}$ and a thickness of from about 0.1 to about 20.0 µm. The substrate may have a carrier concentration of less than about $1 \times 10^{15}$ cm$^{-3}$. The pn junction between the first layer 12 and the substrate 10 may provide blocking capability when the device is in the off-state and carrier injection when the device is in the on-state.

A first region of SiC 14 is provided at a first face 10B of the substrate 10 and is of opposite conductivity type to the substrate 10. In some embodiments of the present invention, the first region is an implanted region that provides a p-well or n-well depending on the polarity of the substrate 10. The first region of SiC 14 may be provided as spaced apart portions when viewed in cross-section with a junction field effect transistor (JFET) region 30 between the spaced apart portions. In particular embodiments of the present invention, the first region of SiC 14 may have a carrier concentration of from about $1.0 \times 10^{15}$ to about $5.0 \times 10^{19}$ cm$^{-3}$ and may extend into the substrate to a depth of from about 0.3 to about 2.0 µm. The spacing between adjacent spaced apart portions of the first region of SiC 14 may be enough so that a neutral channel exists between the top MOS channel to the drift layer. This spacing may be reduced by introducing an implant in the JFET region 30 to increase the carrier concentration in the JFET region 30 between adjacent spaced apart portions of the first region of SiC 14. While the first region of SiC 14 is described herein as being a single region having spaced apart portions, the first region of SiC 14 may also be provided as spaced apart separate regions with a JFET region 30 between the separate regions.

In embodiments of the present invention illustrated in FIG. 1, second and third regions of SiC 18 and 20 of opposite conductivity type may be provided within the first region 14 and at the first face 10B of the substrate 10. In some embodiments, the second and third regions of SiC 18 and 20 may be provided as spaced apart portions when viewed in cross-section as illustrated in FIG. 1. While the second and third regions of SiC 18 and 20 are described herein as being single regions having spaced apart portions, the second and third regions of SiC 18 and 20 may also be provided as multiple spaced apart separate regions within respective first regions of SiC 14.

The second and third regions of SiC 18 and 20 are p$^+$ regions of SiC and n$^+$ regions of SiC, respectively. As used herein, "p$^+$" or "n$^+$" refer to regions that are defined by higher carrier concentrations than are present in adjacent or other regions of the same or another layer or substrate. Similarly, "p$^-$" or "n$^-$" refer to regions that are defined by lower carrier concentrations than are present in adjacent or other regions of the same or another layer or substrate.

In some embodiments of the present invention, the second region of SiC 18 may have carrier concentrations of from about $5.0 \times 10^{17}$ to about $1.0 \times 10^{21}$ cm$^{-3}$ and may extend into the substrate to a depth of from about 0.1 to about 2.0 µm. The second regions of SiC 18 may be implanted with p-type dopants, such as Al or B through ion implantation.

In some embodiments of the present invention, the third region of SiC 20 may have carrier concentrations of from about $5.0 \times 10^{17}$ to about $1.0 \times 10^{21}$ cm$^{-3}$ and may extend into the substrate to a depth of from about 0.1 to about 1.5 µm. The third regions of SiC 20 may be implanted with n-type dopants, such as nitrogen or phosphorous through ion implantation.

In some embodiments of the present invention a planar edge termination structure may also be provided at the first face 10B of the substrate 10. As seen in FIG. 1, floating guard rings may be provided by fourth regions of SiC 16 in the substrate 10 of opposite conductivity type to the substrate 10 and surrounding the first region of SiC 14. The fourth regions of SiC 16 may have carrier concentrations of from about $5.0 \times 10^{17}$ to about $1.0 \times 10^{21}$ cm$^{-3}$ and may extend into the substrate to a depth of from about 0.1 to about 2.0 µm. The fourth regions of SiC 16 may be formed at the same time as the second region of SiC 18. The fourth regions of SiC 16 may be implanted with p-type dopants, such as Al or B through ion implantation.

A gate insulator layer 22 is provided on the substrate 10. The gate insulator 22 may, for example, be an oxide, an oxynitride or an oxide-nitride-oxide structure. In particular embodiments of the present invention, the gate insulator 22 is an oxide that is formed and/or annealed in an NO and/or N$_2$O environment. For example, the gate insulator may be formed as described in U.S. Pat. No. 6,610,366 entitle "METHOD OF N$_2$O ANNEALING AN OXIDE LAYER ON A SILICON CARBIDE LAYER," U.S. Pat. No. 6,767,843 entitled "METHOD OF N$_2$O GROWTH OF AN OXIDE LAYER ON A SILICON CARBIDE LAYER," United States Patent Publication No. 2002/0102358, entitled "METHOD OF FABRICATING AN OXIDE LAYER ON A SILICON CARBIDE LAYER UTILIZING AN ANNEAL IN A HYDROGEN ENVIRONMENT," and/or United States Patent Publication No. 2004/0101625, entitled "NITROGEN PASSIVATION OF INTERFACE STATES IN SIO$_2$/SIC STRUCTURES," the disclosures of which are incorporated herein as if set forth in their entirety.

A gate electrode 26 is provided on the gate insulator layer 22 and disposed above the JFET region 30. The gate electrode 26 may, for example, be n-type or p-type polysilicon, or refractory metals, such as Mo or W and/or metal silicides.

Ohmic contacts 24 and 28 are provided on the second and third regions of SiC 18 and 20 and the first layer of SiC 12, respectively. As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents. The ohmic contacts 24 and 28 may provide emitter and collector contacts for an IGBT according to some embodiments of the present invention. In some embodiments of the present invention, ohmic contacts to $n^+$ regions may be nickel (Ni) and ohmic contacts to $p^+$ regions may be aluminum (Al) based contacts, such Al/(Titanium (Ti)) contacts. It will be understood that these metals are provided for exemplary purposes only and that other suitable metals may also be used without departing from the scope of the present invention.

Metal overlayer(s) (not shown) may be provided on the ohmic contacts 24 and 28 and/or gate electrode 26. The metal overlayer(s) may include, for example, gold, silver, aluminum, platinum and/or copper. Other suitable highly conductive metals may also be used for the overlayer(s). The presence of the overlayer(s) may provide a more suitable device for soldering and/or wire bonding as will be understood by those having skill in the art.

As further illustrated in FIG. 1, the edges of the device may be beveled according to some embodiments of the present invention. The edge beveling process may be performed to provide a bevel edge termination structure. According to some embodiments of the present invention, pn blocking junctions may be provided between the second surface 10A of the substrate 10 and the first layer of SiC 12. Edge beveling is discussed in detail in *Physics of Semiconductor Devices* by S. M. Sze at pages 196-198, the content of which is incorporated herein by reference as if set forth in its entirety.

It will be understood that although embodiments of the present invention discussed with respect to FIG. 1 include an IGBT, embodiments of the present invention are not limited to this configuration. For example, devices having opposite conductivity types may also be provided. In particular, a device may be provided having a p-type SiC substrate 10, an n-type first layer of SiC 12 on the second surface 10A of the substrate 10, an n-type first region of SiC 14 at the first surface 10B of the substrate 10, an $n^+$ second region of SiC 18, a $p^+$ third region of SiC 20 and $n^+$ fourth regions of SiC 16 without departing from the scope of the present invention.

As discussed above, with respect to FIG. 1, devices according to some embodiments of the present invention may be provided on voltage blocking substrates capable of providing a bi-directional voltage blocking layer. Providing devices on voltage blocking substrates may allow the provision of high voltage power devices having p-type or n-type conductivity substrates, which may increase the available polarity of such devices. Furthermore, pn junctions between surfaces of the substrate and layers provided thereon may be more easily identifiable, which may allow provision of devices capable of blocking in multiple directions as discussed herein.

Figure 2A:
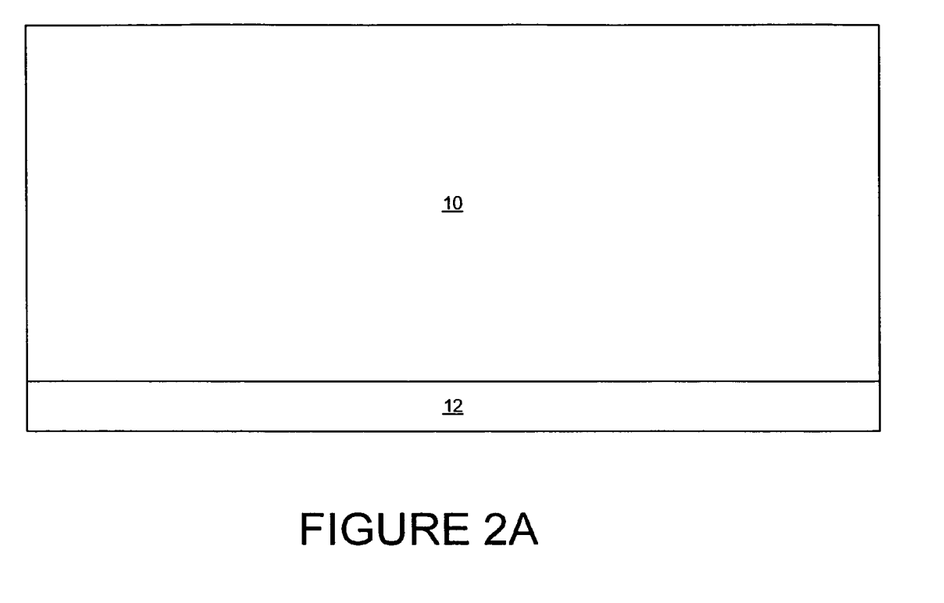
FIGS. 2A through 2H are cross sections illustrating processing steps in the fabrication of high voltage silicon carbide devices, for example, IGBTs, of FIG. 1 according to some embodiments of the present invention.

Referring now to FIGS. 2A through 2H, processing steps in the fabrication of power devices, for example, IGBTs, on voltage blocking substrates according to some embodiments of the present invention will be discussed. As illustrated in FIG. 2A, a first layer of SiC 12 is formed on a second surface 10A of a silicon carbide (SiC) voltage blocking substrate 10. The SiC substrate 10 may be n-type or p-type silicon carbide. For exemplary purposes only, the SiC substrate 10 of FIGS. 2A through 2H is a n-type SiC substrate. In some embodiments of the present invention, the substrate 10 may be a high purity 4H SiC substrate having a carrier concentration of no greater than about $1.0 \times 10^{15}$ cm$^{-3}$ and a thickness of greater than about 100 µm. In some embodiments of the present invention, the voltage blocking substrate may be fabricated using methods discussed in commonly assigned U.S. patent application Ser. No. 11/052679 (Client Ref. No. P0475) entitled *Process for Producing Silicon Carbide Crystals Having Increased Minority Carrier Lifetimes*, filed Feb. 7, 2005, the disclosure of which has been incorporated herein by reference.

The first layer of SiC 12 may be a p-type or an n-type silicon carbide layer and may be grown on the second surface 10A of the substrate 10 or implanted in the second surface 10A of the substrate 10 without departing from the scope of the present invention. If the first layer of SiC 12 is an n-type implanted region, for example, nitrogen or phosphorus ions may be implanted. If, on the other hand the first layer of SiC 12 is a p-type implanted region, for example, Al or boron (B) ions may be implanted. In embodiments of the present invention discussed with respect to FIGS. 2A through 2H, the first layer of SiC 12 may be a p-type epitaxial layer formed on the second surface 10A of a n-type substrate 10. The p-type SiC epitaxial layer 12 may have a carrier concentration of from about $1.0 \times 10^{16}$ to about $1.0 \times 10^{21}$ cm$^{-3}$ and a thickness of from about 0.1 to about 20.0 µm.

Figure 2B:
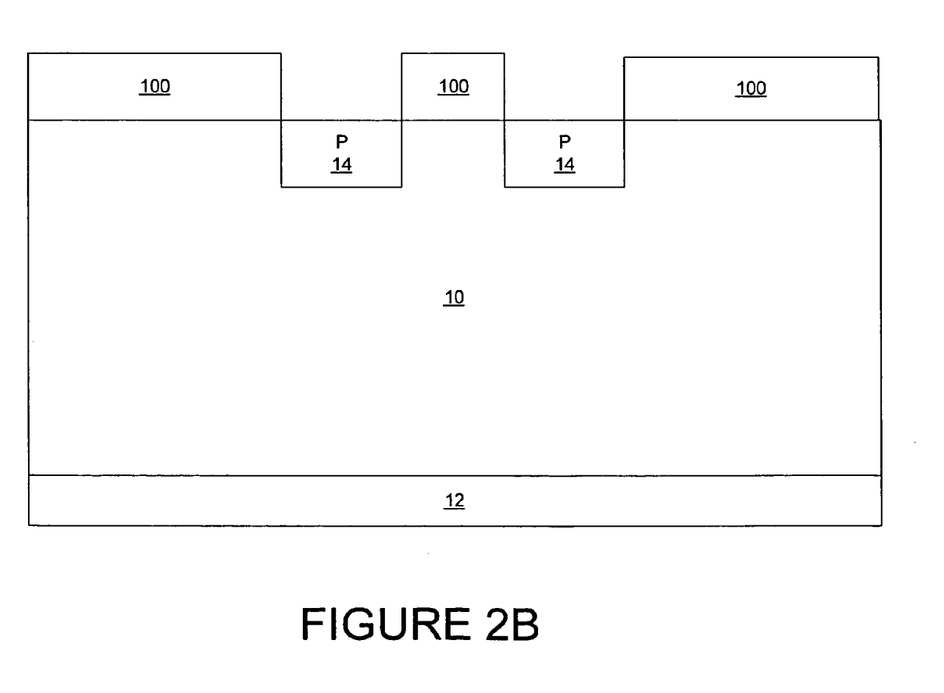

As seen in FIG. 2B, a mask 100 is formed on the first surface 10B of the substrate 10 and patterned to provide openings corresponding to the p-type well regions provided by the first regions of SiC 14. Suitable dopant ions are implanted in the first surface 10B of the substrate 10 using the mask 100 to provide the first regions of SiC 14. According to embodiments of the present invention illustrated in FIGS. 2A through 2H, the first region of SiC 14 may be an p-type implanted region provided at the first surface 10B of the p-type substrate 10. The p-type SiC region 14 may have a carrier concentration of from about $1.0 \times 10^{15}$ to about $5.0 \times 10^{19}$ cm$^{-3}$ and a thickness of from about 0.3 to about 2.0 µm.

Optionally, the mask 100 may be removed and a mask corresponding to the JFET region 30 may be provided. A JFET implant may be carried out as described above so as to reduce the spacing between the p-wells 14.

Figure 2C:
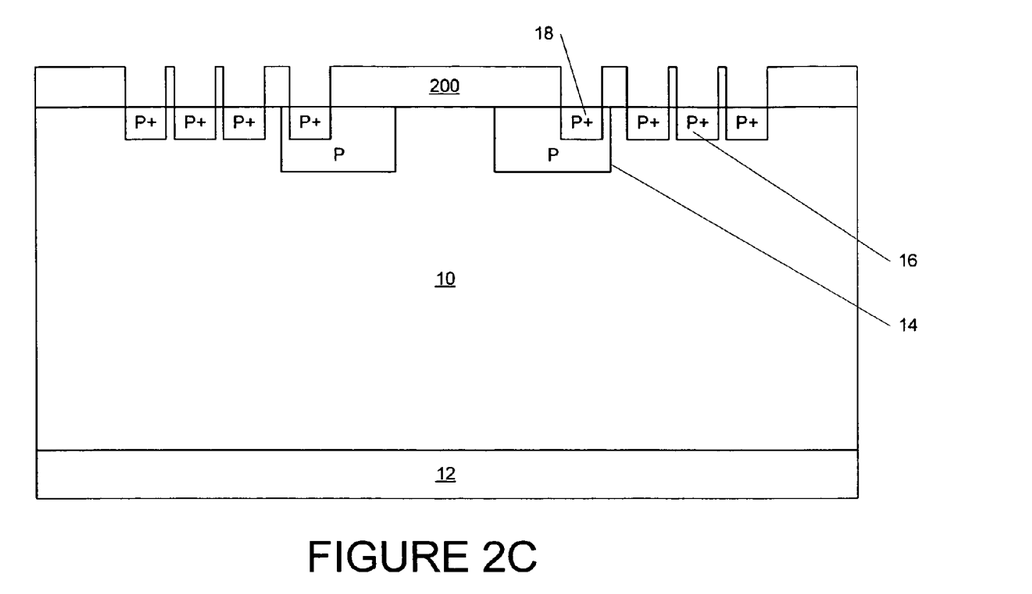

As seen in FIG. 2C, the mask 100 of FIG. 2B is removed and a second mask 200 is formed on the first surface 10B of the substrate 10 and patterned to provide openings corresponding to the second and fourth regions of SiC 18 and 16. According to embodiments of the present invention illustrated in FIGS. 2A through 2H, the second and fourth regions of SiC 18 and 16 may be $p^+$ regions provided at the first surface 10B of the substrate 10. The second and fourth regions of SiC 18 and 16 may have carrier concentrations of from about $5.0 \times 10^{17}$ to about $1.0 \times 10^{21}$ cm$^{-3}$ and thicknesses of from about 0.1 to about 2.0 µm.

Figure 2D:
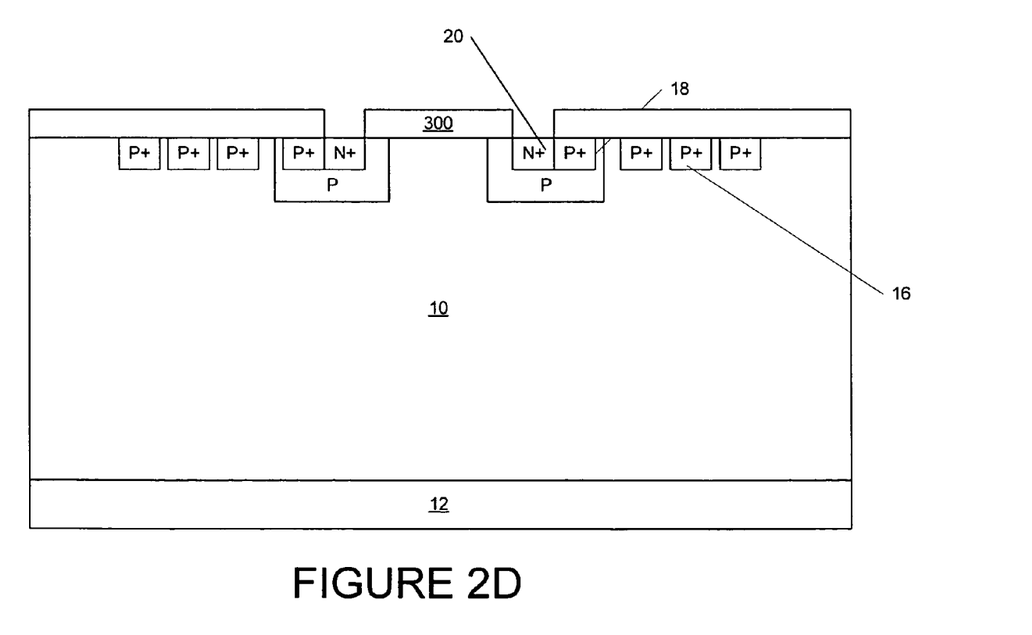

As seen in FIG. 2D, the mask 200 of FIG. 2C is removed and a third mask 300 is formed on the first surface 10B of the substrate 10 and patterned to provide openings corresponding to the third region of SiC 20. According to embodiments of the present invention illustrated in FIGS. 2A through 2H, the third region of SiC 20 may be an $n^+$ region provided at the first surface 10B of the substrate 10. The third region of SiC 20 may have a carrier concentration of from about $5.0 \times 10^{17}$ to about $1.0 \times 10^{21}$ cm$^{-3}$ and a thickness of from about 0.1 to about 1.5 µm.

Optionally, after implantation of the dopants, the resulting structure of FIG. 2D may be annealed to activate the dopants. Alternatively, the activation of the dopants may be provided by another processing step, such as by formation of the gate insulator layer or annealing of the ohmic contacts.

Figure 2E:
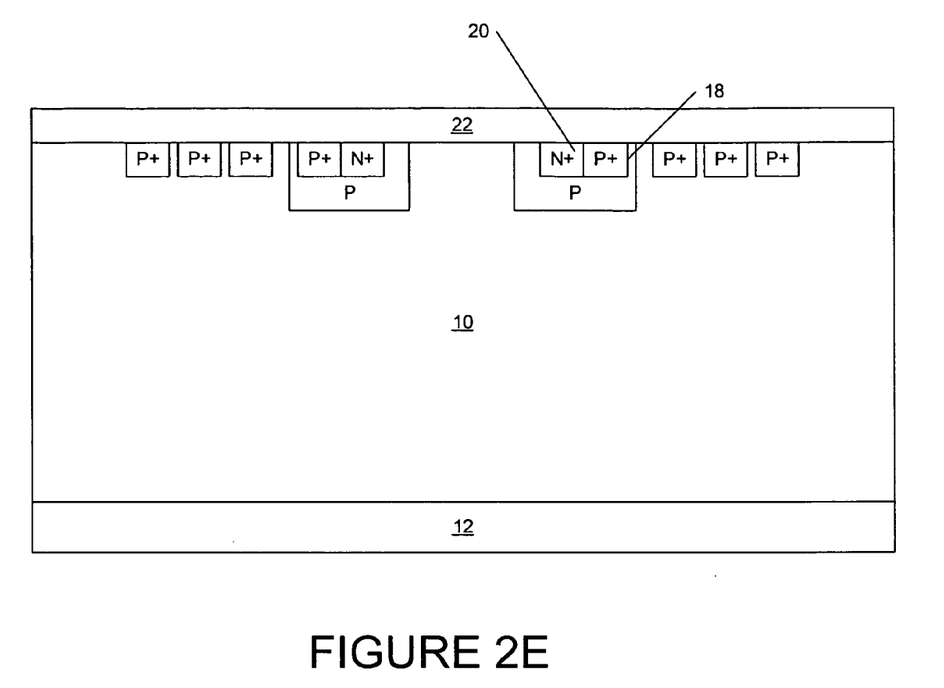

FIG. 2E illustrates the removal of the third mask 300 and formation of the insulator layer 22. The insulator layer 22 may, for example, be grown through thermal oxidation (in which case the depth of the implants may account for the oxidation thickness) and/or may be deposited by, for example, chemical vapor deposition (CVD). The insulator layer 22 may be an oxide grown and/or annealed in NO and/or N$_2$O as described above. For example, the insulator layer 22 may be an oxide grown in a nitridating environment. Optionally, an ONO structure may be provided by thermal oxidation and/or deposition. The gate insulator layer 22 may be formed to a thickness of from about 50 Å to about 4000 Å.

Figure 2F:
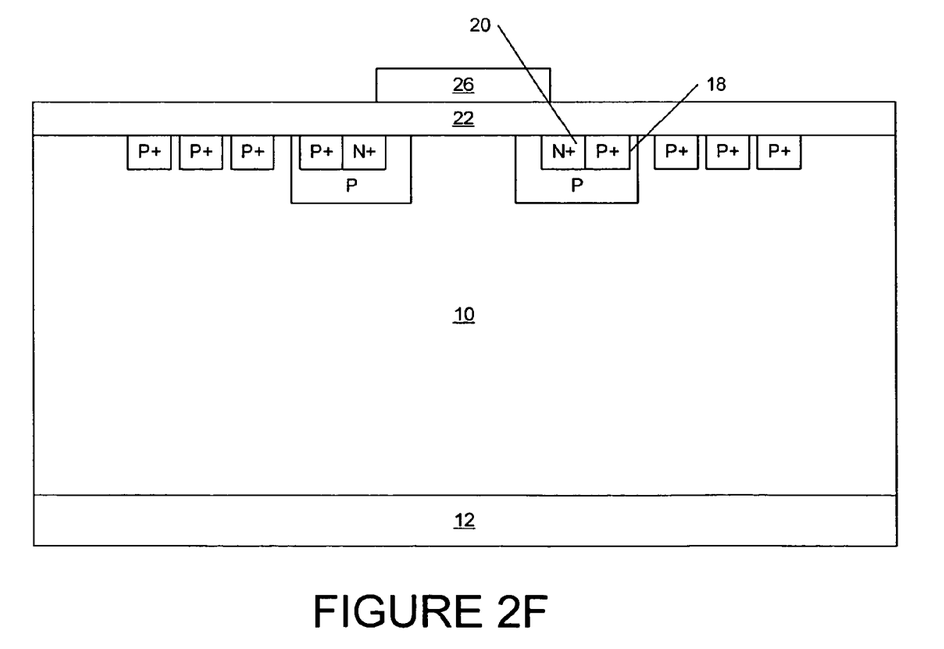

Referring now to FIG. 2F, metal may be deposited on the insulator layer 22 and patterned to provide the gate electrode 26. As discussed above, the gate electrode 26 may be polysilicon, refractory metal(s) and/or silicide(s). Patterning of the gate electrode 26 may be carried out by masking through photolithography to form an etch mask and etching the gate electrode material using the etch mask, lift-off or other patterning techniques known to those of skill in the art.

Figure 2G:
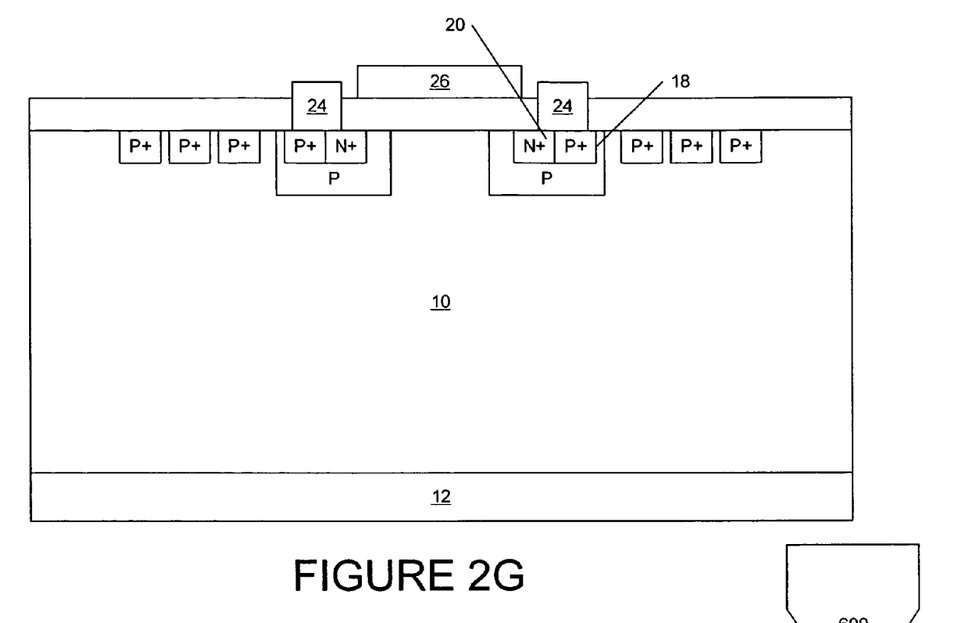
Figure 2H:
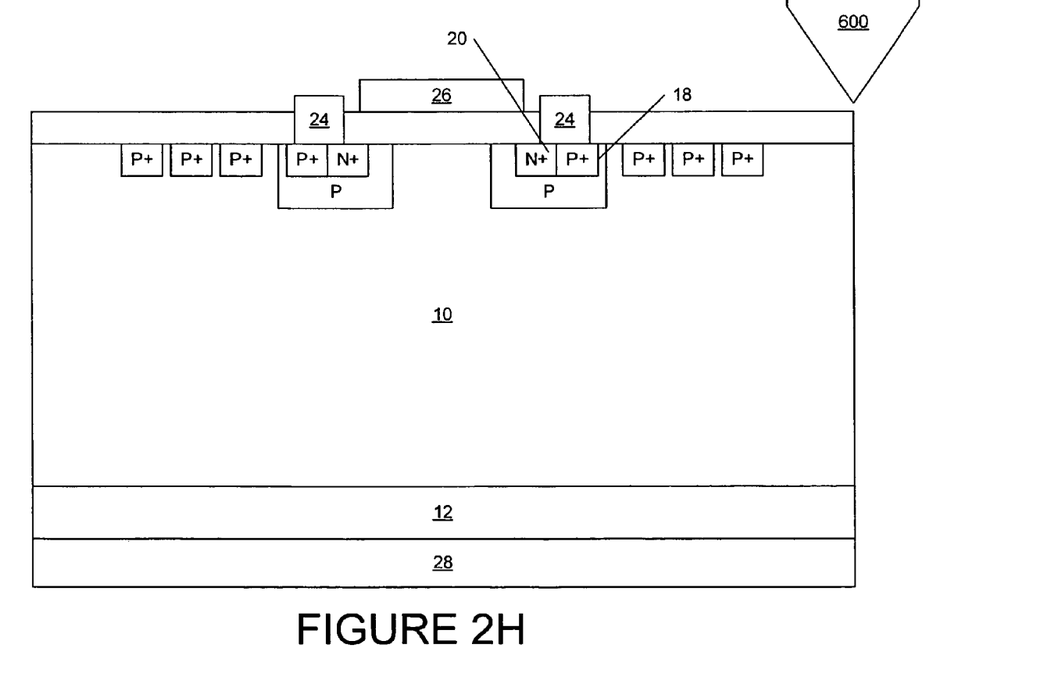

Referring now to FIG. 2G, windows (not shown) corresponding to the ohmic contacts 24 may be opened in the insulator layer 22 corresponding to the contact locations. Accordingly, the contact metal may be deposited in the windows. As seen in FIG. 2H, a contact metal is also deposited on the first layer of SiC 12. As discussed above, nickel (Ni) may be deposited for ohmic contacts on n$^+$ regions and Al based metal compounds, such Al/Ti, may be deposited for ohmic contacts on p$^+$ regions. Once the metals are deposited, the deposited metals may be annealed at temperature from about 500 to about 1200° C. in an inert ambient.

As illustrated in FIG. 2H, the edges of the device may be diced and beveled according to some embodiments of the present invention. Beveling may be performed by, for example, plasma etching or mechanical grinding. Thus, for example, a grinding tool 600 may be used to bevel the edges to provide the shape of the structure illustrated in FIG. 1. The edge beveling process may be performed to provide a bevel edge termination structure. According to some embodiments of the present invention, a pn blocking junction may be provided between the second surface 10A of the substrate 10 and the first layer of SiC 12. Edge beveling is discussed in detail in *Physics of Semiconductor Devices* by S. M. Sze at pages 196-198, the content of which has been incorporated herein by reference. A sacrificial oxide layer (not shown) may be formed on the surface of the device and removed to repair any damage to the surface of the device that may have occurred during the edge beveling process.

It will be understood by those having skill in the art that, although the processing steps in the fabrication of high voltage devices according to embodiments of the present invention are discussed in a particular order herein, the order of steps in FIGS. 2A through 2H may be changed without departing from the scope of the present invention. Accordingly, the present invention should not be construed as limited to the exact sequence of operations described herein but is intended to encompass other sequences of fabrication that will become apparent to those of skill in the art in light of the present disclosure.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A high voltage silicon carbide (SiC) device, comprising:
    a SiC insulated gate bipolar transistor (IGBT) comprising:
        a voltage blocking substrate as a drift region of the IGBT;
        a planar edge termination structure at a first surface of the voltage blocking substrate and surrounding an active region of the IGBT;
        a beveled edge termination structure extending through a second surface of the voltage blocking substrate opposite the first surface of the voltage blocking substrate, wherein the voltage blocking substrate is a boule grown substrate; and
        an epitaxial silicon carbide layer formed on the second surface of the voltage blocking substrate,
    wherein the planar edge termination structure includes a plurality of floating guard rings;
    wherein the epitaxial silicon carbide layer has a conductivity type opposite to a conductivity type of the voltage blocking substrate; and
    wherein the voltage blocking substrate includes an upper portion having a substantially vertical edge and a lower portion having a beveled edge extending to a bottom surface of the epitaxial silicon carbide layer, so as to form the beveled edge termination structure.

2. The device of claim 1, wherein the voltage blocking substrate comprises a 4H—SiC high purity substrate having a carrier concentration no greater than about $1.0 \times 10^{15}$ cm$^{-3}$.

3. The device of claim 2, wherein the voltage blocking substrate has a thickness of greater than about 100 µm.

4. The device of claim 1, wherein the voltage blocking substrate comprises an n-type SiC substrate.

5. The device of claim 1, wherein the voltage blocking substrate comprises a p-type SiC substrate.

6. A high voltage silicon carbide (SiC) device, comprising:
    a first SiC layer having a first conductivity type on a first surface of a voltage blocking SiC substrate having a second conductivity type opposite to the first conductivity type;
    a first region of SiC at a second surface of the voltage blocking substrate and having the first conductivity type;
    a second region of SiC in the first region of SiC, the second region having the first conductivity type and having a carrier concentration higher than a carrier concentration of the first region;
    a third region of SiC in the first region of SiC, the third region having the second conductivity type;
    an insulator layer on the second surface of the voltage blocking substrate;
    a gate electrode on the insulator layer and adjacent the first and third regions of SiC;
    a first contact on the second and third regions of SiC;
    a second contact on a bottom surface of the first SiC layer, wherein the voltage blocking substrate is a boule grown substrate;
    a planar edge termination structure at the second surface of the voltage blocking substrate; and
    a beveled edge termination structure at the first surface of the voltage blocking substrate opposite to the second surface of the substrate,
    wherein the planar edge termination structure includes a plurality of floating guard rings; and
    wherein the voltage blocking substrate includes an upper portion having a substantially vertical edge and a lower portion having a beveled edge extending to the bottom surface of the first SiC layer, so as to form the beveled edge termination structure.

7. The device of claim 6, wherein the voltage blocking substrate comprises a 4H—SiC high purity substrate having a carrier concentration no greater than about $1.0 \times 10^{15}$ cm$^{-3}$.

8. The device of claim 7, wherein the voltage blocking substrate has a thickness of greater than about 100 µm.

9. The device of claim 6, wherein the first conductivity type comprises p-type SiC and the second conductivity type comprises n-type SiC.

10. The device of claim 6, wherein the first conductivity type comprises n-type SiC and the second conductivity type comprises p-type SiC.

11. The device of claim 6, wherein the first SiC layer has a thickness of from about 0.1 to about 20.0 μm.

12. The device of claim 6, wherein the first SiC layer has a carrier concentration of from about $1\times10^{16}$ to about $1\times10^{21}$ cm$^{-3}$.

13. The device of claim 6, wherein the first SiC region has a carrier concentration of from about $1\times10^{15}$ to about $5\times10$ cm$^{-3}$.

14. The device of claim 6, wherein the first SiC region has a depth of from about 0.3 to about 2.0 μm.

15. The device of claim 6, wherein the second SiC region has a carrier concentration of from about $5\times10^{17}$ to about $1\times10^{21}$ cm$^{-3}$.

16. The device of claim 6, wherein the second SiC region has a depth of from about 0.1 to about 2.0 μm.

17. The device of claim 6, wherein the third SiC region has a carrier concentration of from about $5\times10^{17}$ to about $1\times10^{21}$ cm$^{-3}$.

18. The device of claim 6, wherein the third SiC region has a depth of from about 0.1 to about 1.5 μm.

19. The device of claim 6, wherein the floating guard rings have a carrier concentration of from about $5\times10^{17}$ to about $1\times10^{21}$ cm$^{-3}$.

20. The device of claim 6, wherein the floating guard rings have a depth of from about 0.1 to about 2.0 μm.

21. The device of claim 6, wherein the floating guard rings have the second conductivity types;
   wherein the first SiC layer has a thickness of from about 0.1 to about 20.0 μm and a carrier concentration of from about $1\times10^{16}$ to about $1\times10^{21}$ cm$^{-3}$;
   wherein the first SiC region has a carrier concentration of from about $1\times10^{15}$ to about $5\times10^{19}$ cm$^{-3}$ and a depth of from about 0.3 to about 2.0 μm;
   wherein the second SiC region has a carrier concentration of from about $5\times10^{17}$ to about $1\times10^{21}$ cm$^{-3}$ and a depth of from about 0.1 to about 2.0 μm;
   wherein the third SiC region has a carrier concentration of from about $5\times10^{17}$ to about $1\times10^{21}$ cm$^{-3}$ and a depth of from about 0.1 to about 1.5 μm; and
   wherein the the floating guard rings have a carrier concentration of from about $5\times10^{17}$ to about $1\times10^{21}$ cm$^{-3}$ and a depth of from about 0.1 to about 2.0 μm.

* * * * *

UNITED STATES PATENT AND TRADEMARK OFFICE
CERTIFICATE OF CORRECTION

PATENT NO. : 7,414,268 B2
APPLICATION NO. : 11/132355
DATED : August 19, 2008
INVENTOR(S) : Ryu et al.

It is certified that error appears in the above-identified patent and that said Letters Patent is hereby corrected as shown below:

Title Page
Item 56, Other Publications, Page 2, Column 2:
Please correct "Bharnagar et al." to read -- Bhatnagar et al. --

In the Claims:
Column 13, Claim 13, Line 15: Please correct "$5\times10\text{cm}^{-3}$"
To read -- $5\times10^{19}\text{cm}^{-3}$ --

Signed and Sealed this

Fourth Day of November, 2008

JON W. DUDAS
*Director of the United States Patent and Trademark Office*